United States Patent
Avritch et al.

(10) Patent No.: US 10,243,502 B1
(45) Date of Patent: Mar. 26, 2019

(54) SYSTEM AND METHOD FOR DETECTING LATENT FAULTS IN A REDUNDANT MOTOR APPLICATION

(71) Applicant: HAMILTON SUNDSTRAND CORPORATION, Charlotte, NC (US)

(72) Inventors: Steven A. Avritch, Bristol, CT (US); David F. Dickie, Bloomfield, CT (US)

(73) Assignee: HAMILTON SUNDSTRAND CORPORATION, Charlotte, NC (US)

(*) Notice: Subject to any disclaimer, the term of this patent is extended or adjusted under 35 U.S.C. 154(b) by 0 days.

(21) Appl. No.: 15/902,736

(22) Filed: Feb. 22, 2018

(51) Int. Cl.
*H02K 41/00* (2006.01)
*H02P 29/024* (2016.01)
*H02P 25/064* (2016.01)
*G01R 31/34* (2006.01)
*G01R 19/165* (2006.01)
*B64F 5/60* (2017.01)
*H02K 11/27* (2016.01)
*H02K 16/00* (2006.01)
*H02K 41/03* (2006.01)

(52) U.S. Cl.
CPC ...... *H02P 29/024* (2013.01); *G01R 19/16528* (2013.01); *G01R 31/343* (2013.01); *G01R 31/346* (2013.01); *H02P 25/064* (2016.02); *B64F 5/60* (2017.01); *H02K 11/27* (2016.01); *H02K 16/00* (2013.01); *H02K 41/031* (2013.01)

(58) Field of Classification Search
CPC ................................. H02P 6/28; H02K 1/00
See application file for complete search history.

(56) References Cited

U.S. PATENT DOCUMENTS

| 5,670,856 A | 9/1997 | Le et al. |
| 8,450,894 B2 | 5/2013 | Blanding et al. |
| 2012/0187873 A1* | 7/2012 | Nomura .................. H02P 25/06 318/135 |
| 2016/0339881 A1 | 11/2016 | Abbott et al. |

* cited by examiner

*Primary Examiner* — Karen Masih

(57) ABSTRACT

A system for monitoring a motor includes a movable component having a plurality of permanent magnets. The system also includes a plurality of stators having phase windings and surrounding the movable component. The system also includes a plurality of current sensors each configured to detect a detected current flowing to a corresponding stator of the plurality of stators. The system also includes a monitor configured to receive the detected current, perform a comparison of the detected current from each of the plurality of stators, and to identify a loss of redundancy of the motor based on the comparison.

17 Claims, 5 Drawing Sheets

SYSTEM AND METHOD FOR DETECTING LATENT FAULTS IN A REDUNDANT MOTOR APPLICATION

FIELD

The present disclosure is directed to systems and methods for identifying a loss of redundancy due to latent faults of a motor.

BACKGROUND

A linear motor actuator may include a plurality of stators having windings that surround a translator rod. The translator rod may include a plurality of permanent magnets positioned thereon or coupled thereto. The linear motor actuator may further include a plurality of controllers that each provide current to a corresponding stator. As the current flows through the windings of the stators, a magnetic field is generated. The magnetic field forces the translator rod to move in either direction along a common actuation axis.

A control loop may be used by the controllers to control the current provided to each stator. If a sufficiently great amount of force is requested of the linear motor actuator (i.e., an amount of force that cannot be provided without all the stators providing current) then the system may identify a fault by determining that the requested force cannot be achieved. However, conventional linear motor actuators are incapable of identifying latent faults (which may occur when the amount of force requested can be provided by current from less than all the stators) because the control loop causes the non-faulty stators to make up for the lack of current from the faulty stator.

SUMMARY

Described herein is a system for monitoring a motor. The system includes a movable component having a plurality of permanent magnets. The system also includes a plurality of stators having phase windings and surrounding the movable component. The system also includes a plurality of current sensors each configured to detect a detected current flowing to a corresponding stator of the plurality of stators. The system also includes a monitor configured to receive the detected current, perform a comparison of the detected current from each of the plurality of stators, and to identify a loss of redundancy of the motor based on the comparison.

Any of the foregoing embodiments may also include a plurality of controllers each configured to control the corresponding stator of the plurality of stators.

In any of the foregoing embodiments, each of the plurality of current sensors is located in a corresponding controller of the plurality of controllers.

In any of the foregoing embodiments, one of the plurality of controllers is a master controller and each remaining controller of the plurality of controllers is a slave controller.

In any of the foregoing embodiments, the monitor is included in the master controller.

In any of the foregoing embodiments, the monitor is configured to identify the loss of redundancy in response to at least one stator of the plurality of stators having a different detected current than another stator of the plurality of stators.

In any of the foregoing embodiments, the plurality of stators includes at least three stators, and wherein the monitor is further configured to identify a faulty stator in response to identifying that the detected current of at least two of the plurality of stators are within a tolerance current level of each other, and that the detected current of the faulty stator is outside of the tolerance current level.

In any of the foregoing embodiments, the monitor is further configured to cause the faulty stator to cease receiving current.

Any of the foregoing embodiments may also include an output device configured to output data and wherein the monitor is further configured to control the output device to output a notification indicating the loss of redundancy of the motor.

Also disclosed is a system for monitoring a motor. The system includes a movable component having a plurality of permanent magnets. The system also includes a plurality of stators having phase windings and surrounding the movable component. The system also includes a plurality of current sensors each configured to detect a detected current flowing to a corresponding stator of the plurality of stators. The system also includes a plurality of controllers each configured to control the corresponding stator of the plurality of stators and including a master controller configured to receive the detected current, perform a comparison of the detected current from each of the plurality of stators, and identify a loss of redundancy of the motor based on the comparison.

In any of the foregoing embodiments, each of the plurality of current sensors is located in a corresponding controller of the plurality of controllers.

In any of the foregoing embodiments, the master controller is configured to identify the loss of redundancy in response to at least one stator of the plurality of stators having a different detected current than another stator of the plurality of stators.

In any of the foregoing embodiments, the plurality of stators includes at least three stators, and wherein the master controller is further configured to identify a faulty stator in response to identifying that the detected current of at least two of the plurality of stators are within a tolerance current level of each other, and that the detected current of the faulty stator is outside of the tolerance current level.

In any of the foregoing embodiments, the master controller is further configured to cause the faulty stator to cease receiving current.

Any of the foregoing embodiments may also include an output device configured to output data including a notification indicating the loss of redundancy of the motor.

Also disclosed is a method for monitoring a motor. The method includes receiving, by a monitor, a detected current corresponding to each of a plurality of stators. The method also includes performing a comparison, by the monitor, of the detected current from each of the plurality of stators. The method also includes identifying, by the monitor, a loss of redundancy of the motor based on the comparison.

In any of the foregoing embodiments, identifying the loss of redundancy of the motor includes identifying the loss of redundancy in response to at least one stator of the plurality of stators having a different detected current than another stator of the plurality of stators.

Any of the foregoing embodiments may also include identifying, by the monitor, a faulty stator in response to identifying that the detected current of at least two of the plurality of stators are within a tolerance current level of each other, and that the detected current of the faulty stator is outside of the tolerance current level.

Any of the foregoing embodiments may also include preventing, by the monitor, the faulty stator from receiving current.

Any of the foregoing embodiments may also include outputting, by an output device, output data including a notification indicating the loss of redundancy of the motor.

The forgoing features and elements may be combined in various combinations without exclusivity, unless expressly indicated herein otherwise. These features and elements as well as the operation of the disclosed embodiments will become more apparent in light of the following description and accompanying drawings.

BRIEF DESCRIPTION OF THE DRAWINGS

The subject matter of the present disclosure is particularly pointed out and distinctly claimed in the concluding portion of the specification. A more complete understanding of the present disclosures, however, may best be obtained by referring to the detailed description and claims when considered in connection with the drawing figures, wherein like numerals denote like elements.

DETAILED DESCRIPTION

The detailed description of exemplary embodiments herein makes reference to the accompanying drawings, which show exemplary embodiments by way of illustration and their best mode. While these exemplary embodiments are described in sufficient detail to enable those skilled in the art to practice the disclosure, it should be understood that other embodiments may be realized and that logical, chemical, and mechanical changes may be made without departing from the spirit and scope of the disclosure. Thus, the detailed description herein is presented for purposes of illustration only and not of limitation. For example, the steps recited in any of the method or process descriptions may be executed in any order and are not necessarily limited to the order presented. Furthermore, any reference to singular includes plural embodiments, and any reference to more than one component or step may include a singular embodiment or step. Also, any reference to attached, fixed, connected or the like may include permanent, removable, temporary, partial, full and/or any other possible attachment option. Additionally, any reference to without contact (or similar phrases) may also include reduced contact or minimal contact.

Figure 1:
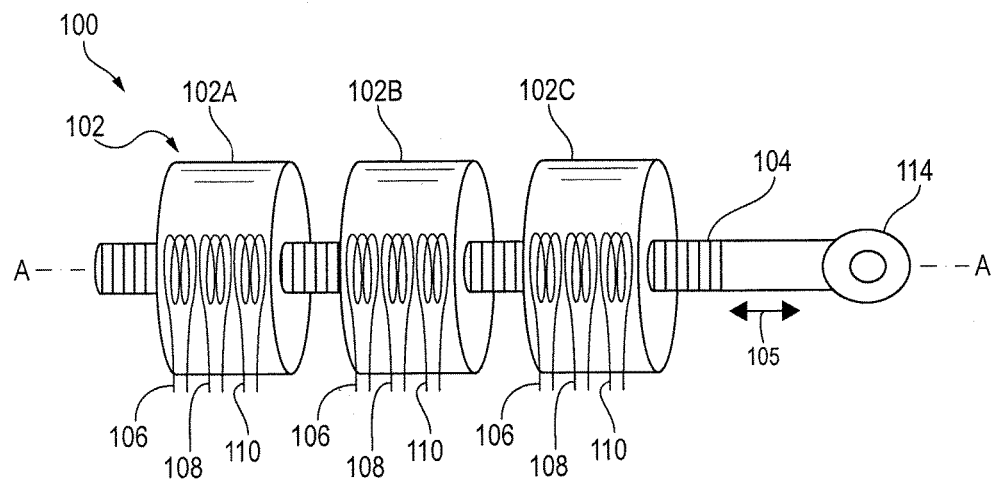
FIG. 1 is a schematic perspective view of a portion of an exemplary embodiment of a motor showing three redundant stators along a translator rod, in accordance with various embodiments of the present disclosure.

For purposes of explanation and illustration, and not limitation, a partial view of an exemplary embodiment of a linear motor actuator 100 in accordance with various embodiments of the disclosure is shown in FIG. 1. Various embodiments of linear motor actuators are illustrated in FIGS. 2-5, as will be described below. The systems and methods described herein can be used to provide electromechanical actuators (EMA's) with multiple redundancies, jam free operation, and low failure rate, e.g., for use in fly by wire aerospace applications.

The linear motor actuator 100, or motor 100, may include a plurality of stators 102, including a first stator 102A, a second stator 102B, and a third stator 102C, that are mounted stationary relative to one another along a common actuation axis A. A translator rod 104 is configured for use with the stators 102, e.g., with each stator 102 wrapped around a movable component 104, such as a translator rod 104, for linear motion relative to the stators 102 along the actuation axis A via magnetic fields. Although in various embodiments, the translator rod 104 may be replaced by a rotor (i.e., another movable component 104) that rotates about the axis A rather than translating along the axis A.

Each stator 102 is magnetically coupled to the translator rod 104 to drive motion of the translator rod 104 along the actuation axis A as indicated by a double arrow 105. Each stator 102 includes a plurality of phase windings, e.g., three phase windings 106, 108, and 110, each phased apart from the others by 120 degrees, to drive motion of the translator rod 104 in a phased series of magnetic impulses from the phase windings 106, 108, and 110. The embodiment of FIG. 1 is a three-phase embodiment, but those skilled in the art will readily appreciate that any other suitable configuration of control mechanization is also possible, e.g. two-phase, four-phase, etc., without departing from the scope of the disclosure.

Figure 2:
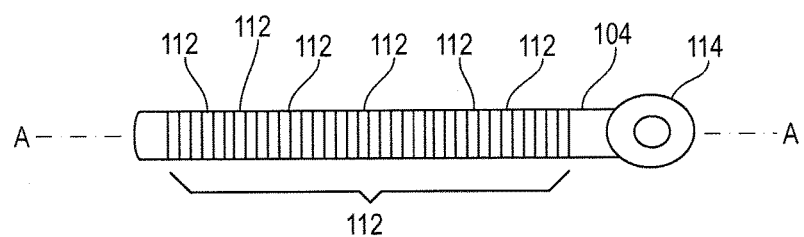
FIG. 2 is a schematic view of the translator rod of FIG. 1, showing permanent magnets stacked along an actuation axis, in accordance with various embodiments of the present disclosure.
Figure 3:
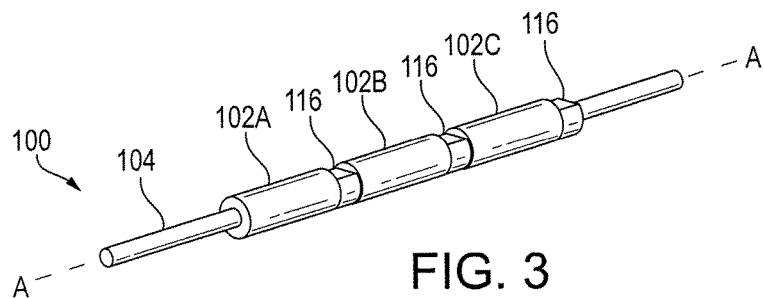
FIG. 3 is a perspective view of a portion of the linear motor actuator of FIG. 1, showing an example of spacing of the stators along an actuation axis, in accordance with various embodiments of the present disclosure.

Referring now to FIG. 2, the translator rod 104 includes a plurality of permanent magnets 112 stacked along the actuation axis A, not all of which are labeled in FIG. 2 for sake of clarity, and a clevis 114 for attachment of mechanical components to be actuated. Referring to FIGS. 1 and 2, the permanent magnets 112 and the phase windings 106, 108, and 110 of each of the stators 102 are magnetically coupled to drive motion of the translator rod 104 along the actuation axis A. As shown in FIG. 3, the stators 102 can be spaced apart from one another along the actuation axis A, e.g., by a respective at least one of wire or spacer 116 between each pair of adjacent stators 102.

Figure 4:
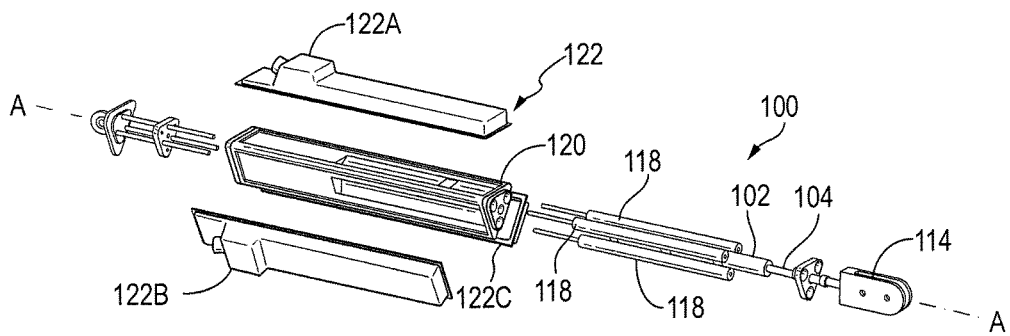
FIG. 4 is an exploded perspective view of the linear motor actuator of FIG. 1 showing position sensors, in accordance with various embodiments of the present disclosure.

With reference now to FIG. 4, a plurality of position sensors 118 are operatively connected to the stators 102 and the translator rod 104 for producing independent signals indicative of relative position of the stators 102 and the translator rod 104. Any suitable type of position sensors can be used, such as linear variable differential transformers, capacitive transducers, ultrasonic sensors, or the like. Three position sensors 118 may be used and spaced apart circumferentially about the stators 102 in a triangular cross-sectional configuration about the actuation axis A, and the position sensors 118 and stators 102 may be mounted in a housing 120 which may have a triangular, or any other, shape. Those skilled in the art will readily appreciate that any other suitable number of position sensors can be used without departing from the scope of this disclosure, and likewise that all position sensors may be mounted in a different configuration such as side-by-side, above or below the translator, or any other suitable mounting position.

Figure 5:
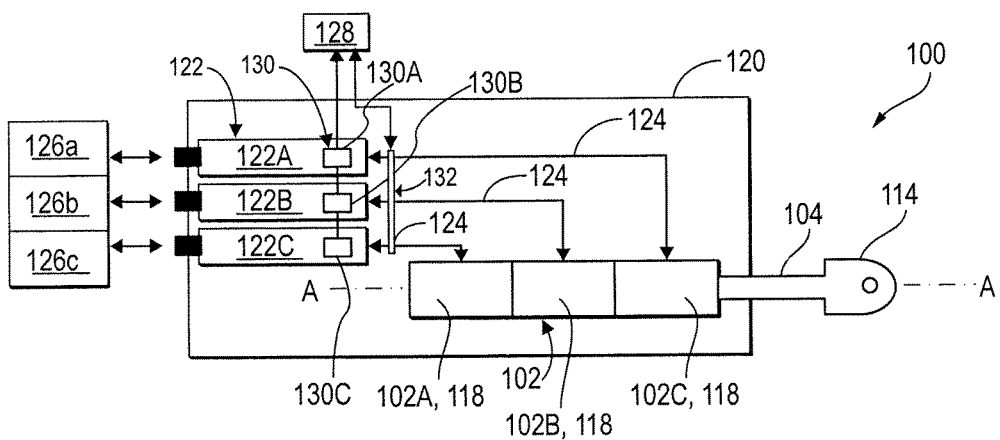
FIG. 5 is a schematic view of the linear motor actuator of FIG. 1 showing control loops for controlling the three stators, in accordance with various embodiments of the present disclosure.

Referring now to FIGS. 4 and 5, each stator 102 includes a separate respective controller 122 for redundancy, i.e., phase windings 106, 108, and 110 of each of the stators 102 are connected to the controller 122 of the respective stator 102. Each respective stator 102 is operatively connected to a respective one of the controller 122 and a respective one of the position sensors 118 as an independent, redundant control loop 124. For example, a first controller 122A may be connected to the first stator 102A, a second controller 122B may be connected to the second stator 102B, and a third controller 122C may be connected to the third stator 102C.

There may be three independent, redundant control loops 124 each including a respective one of the stators 102, position sensors 118, and controllers 122. Those skilled in the art will readily appreciate that any other suitable number of control loops can be used without departing from the scope of this disclosure.

The stators 102 and translator rod 104 are designed to allow free motion of the translator rod 104 under magnetic impulses from any remaining operational one more of the stators 102 in the event of one or more of the stators 102 failing or going off line. Thus, as long as only one stator 102 is functional, the linear motor actuator 100 can function as an EMA. In other words, failure of a stator 102 does not jam the linear motor actuator 100, reducing the tendency for the linear motor actuator 100 to jam as well as providing redundancy. This redundancy makes it possible for the stators 102 and translator rod 104 to be relatively reliable.

Independent modules 126a, 126b, and 126c are operatively connected to the independent, redundant control loops 124. The modules 126a, 126b, and 126c can be redundant flight control computers, autopilot computers, vehicle management computers, or the like, that provide a desired position of the translator rod 104 and/or other configuration commands to the controllers 122. The controllers 122 are designed to force balance the stators 102 by slaving a plurality of the stators 102 as slave stators to one of the stators 102 as a master stator to coordinate and avoid competing impulses from the stators 102 on the translator rod 104. For example, the first stator 102A may be the master and the other two stators 102B, 102C are slaves. In that regard, the first controller 122A may be regarded as the master controller, and the other two controllers 122B, 122C may be regarded as slave controllers.

If there is a discrepancy wherein the three control loops 124 are in disagreement with respect to the actual position of translator rod 104 relative to the stators 102, rather than generate forces opposing one another to reach a command position, the stators may all conform to the position reading of the master stator 102. The controllers 122 can be configured to detect going off line of the master stator and to reconfigure one of the slave stators as a new master stator in the event of the master stator going off line. Those skilled in the art will readily appreciate that the controllers 122 can be co-located with the stators/translator or remotely mounted.

The electronics controllers that drive the stators and determine master/slave status may be the controllers 122 in FIG. 5. The block with modules 126a, 126b, and 126c may include, for example, an upstream flight control system that provides position commands. This block may include the same redundancy as the motor controllers/controllers 122. The controllers 122 may do all of the decision making. The modules 126a, 126b, and 126c may optionally have the ability to override the decisions of controllers 122.

A method of controlling a linear actuator, e.g., linear motor actuator 100, includes slaving a plurality of slave stators, e.g., two of stators 102, in a linear motor actuator to a master stator, e.g., the remaining one of the three stators 102, in the linear motor actuator, wherein each stator is magnetically coupled to a common translator rod, e.g., translator rod 104, to drive motion of the translator rod along an actuation axis, e.g., actuation axis A. The method also includes detecting the master stator going off line and reconfiguring one of the slave stators as a new master stator and slaving any remaining operational slave stators to the new master stator.

As shown in FIG. 5, each of the controllers 122 may include a corresponding sensor 130. The sensor may include a current sensor capable of detecting an amount of current flowing from the controllers 122 to a corresponding stator 102. In particular, the first controller 122A includes a first current sensor 130A, the second controller 122B includes a second current sensor 130B, and the third controller 122C includes a third current sensor 130C.

The linear motor actuator 100 may further include a monitor 128. In various embodiments, the monitor 128 may include a controller or processor capable of performing logic-based functions. In various embodiments, the monitor 128 may be included in one or more of the modules 126a, 126a, 126a, or may be replaced by one or more of the modules 126a, 126a, 126a. The monitor 128 may be connected to each of the current sensors 130 and may receive the detected current that is delivered to each of the stators 102.

The monitor 128 may be designed to monitor operation of the linear motor actuator 100. In particular, the monitor 128 may identify a loss of redundancy of the linear motor actuator 100. As described above and due to the control loops, during normal operation of the linear motor actuator 100, each of the stators 102 should receive the same amount of current that is within a relatively small tolerance current level. For example, the tolerance current level may be 5 percent (5%), 10%, 15%, or the like.

The monitor 128 may compare the received detected current from each of the current sensors 130. If the detected current from any two of the current sensors 130 is different by a value that is greater than the tolerance current level, then the monitor 128 may identify that the linear motor actuator 100 has lost redundancy, meaning that at least one controller 122 or at least one stator 102 is operating improperly. In various embodiments, the monitor 128 may avoid identification of loss of redundancy unless the detected current is different by a value greater than the tolerance current level for a predetermined amount of time, such as 5 seconds, 10 seconds, 15 seconds, or the like.

If the detected current from two of the current sensors 130 are within the tolerance current level and the detected current from another current sensor 130 is outside of the tolerance current level, then the monitor 128 may determine that the controller 122 or stator 102 that is associated with the current sensor 130 that is outside of the tolerance current level is functioning improperly (i.e., faulty). For example, if the detected current from the first current sensor 130A and from the second current sensor 130B are the same or within the tolerance current level, and the detected current from the third current sensor 130C is different by a value that is greater than the tolerance current level, then the monitor 128 may determine that the third controller 122C or the third stator 102C is faulty.

In various embodiments, the monitor 128 may cause the faulty stator to become removed from operation. For example, the monitor 128 may cause the faulty stator (such as the third stator 102C continuing the above example) to cease receiving current. In various embodiments, the monitor 128 may instruct or otherwise cause the third controller 122C (assuming the third stator 102C is the faulty stator) to cease providing current to the third stator 102C. In various embodiments, switches 132 may be connected between each of the controllers 122 and the stators 102, and the monitor 128 may control a corresponding switch 132 to isolate (i.e., prevent current from flowing to) the faulty stator (e.g., the third stator 102C).

Figure 6:
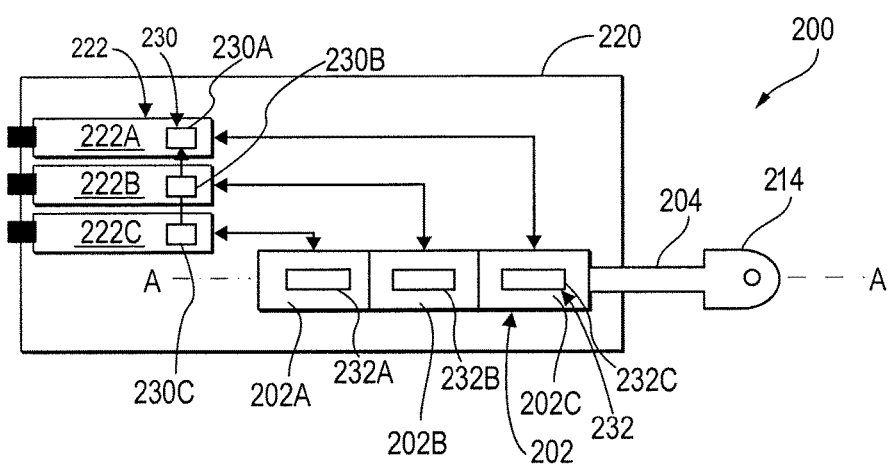
FIG. 6 is a schematic view of a linear motor actuator having similar features as the linear motor actuator of FIG. 1, in accordance with various embodiments of the present disclosure.

Turning now to FIG. 6, another linear motor actuator 200 is shown. The linear motor actuator 200 includes similar components as the linear motor actuator 100 of FIG. 1. In particular, the linear motor actuator 200 may include a plurality of stators 202 including a first stator 202A, a second stator 202B, and a third stator 202C. The linear motor actuator 200 may further include a translator rod 204 having a clevis 214.

The linear motor actuator 100 may further include a plurality of controllers 222, each coupled to a corresponding stator 202 and designed to control operation (i.e., current delivered to) the corresponding stator 202. In particular, the plurality of controllers 222 includes a first controller 222A, a second controller 222B, and a third controller 222C. One of the plurality of controllers 222 (e.g. the first controller 222A) may be a master controller, and the remaining controllers 222 (e.g. the second controller 222B and the third controller 222C) may be slave controllers.

Each of the controllers 222 may include a corresponding current sensor 230. For example, the first controller 222A may include a first current sensor 230A, the second controller 222B may include a second current sensor 230B, and the third controller 222C may include a third current sensor 230C. Additionally or instead, each of the stators 202 may include a current sensor 232. For example, the first stator 202A may include a current sensor 232A, the second stator 202B may include a current sensor 232B, and the third stator 202C may include a current sensor 232C. The current sensors 232 may detect an amount of current received by the corresponding stator 202.

The master controller (e.g. the first controller 222A) may operate in a similar manner as the monitor 128 of FIG. 5. In that regard, the master controller may receive the detected current from at least one of each of the current sensors 230 or each of the current sensors 232. The master controller may compare the detected currents and identify a loss of redundancy (and potentially a faulty stator 102) based on the comparison of the detected currents.

Figure 7:
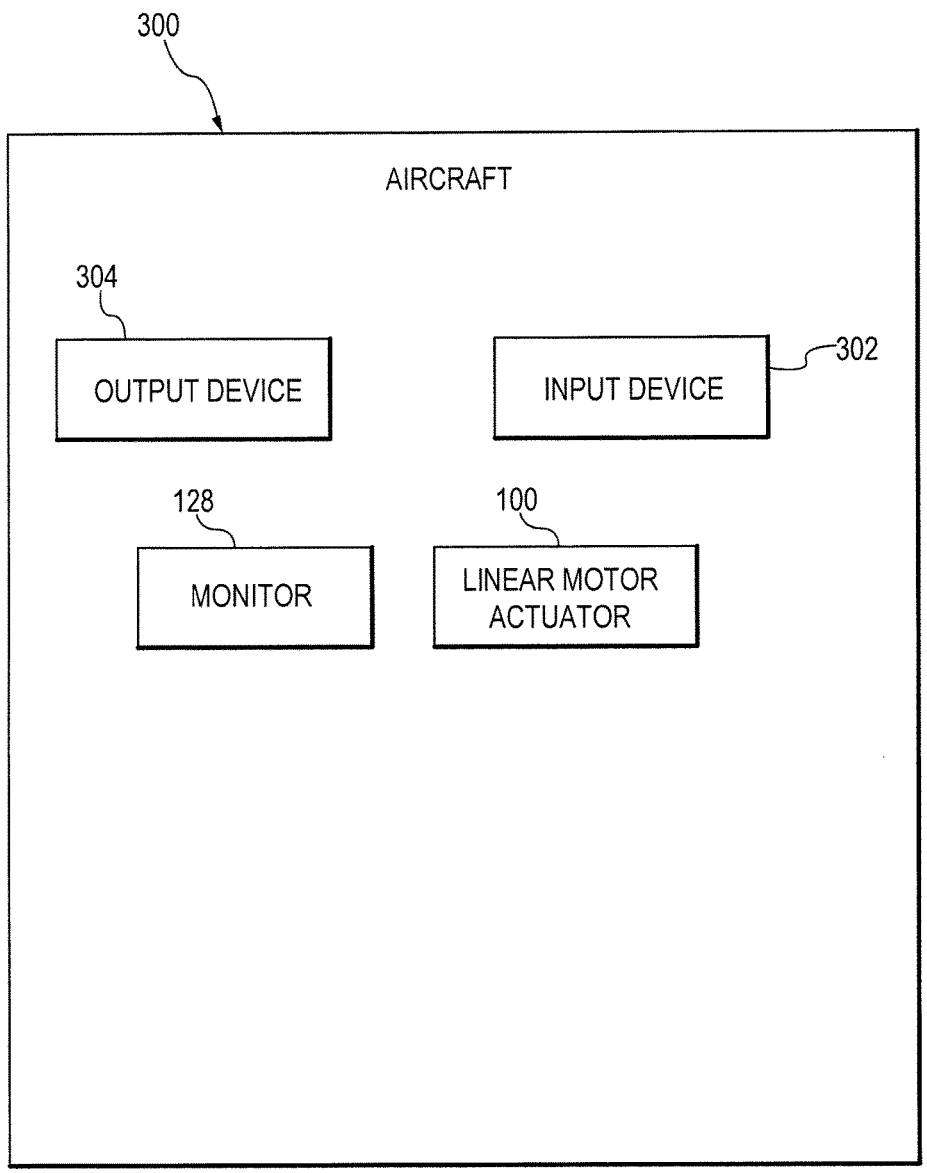
FIG. 7 is a drawing of an aircraft utilizing the linear motor actuator of FIG. 1, in accordance with various embodiments of the present disclosure.

Turning to FIG. 7, the linear motor actuator 100 may be utilized in an aircraft 300, such as an airplane, a helicopter, or the like. The aircraft 300 may further include an input device 302 and an output device 304. The input device 302 may be used by an operator of the aircraft 300 to control operation of the aircraft 300.

The monitor 128 may control the output device 304 to output data regarding the status of the linear motor actuator 100. For example, the monitor 128 may control the output device 304 to output data indicating a loss of redundancy. In various embodiments, the monitor 128 may control the output device 304 to output data indicating or identifying a faulty stator, and/or to output data indicating the detected currents for each stator of the linear motor actuator 100.

Figure 8:
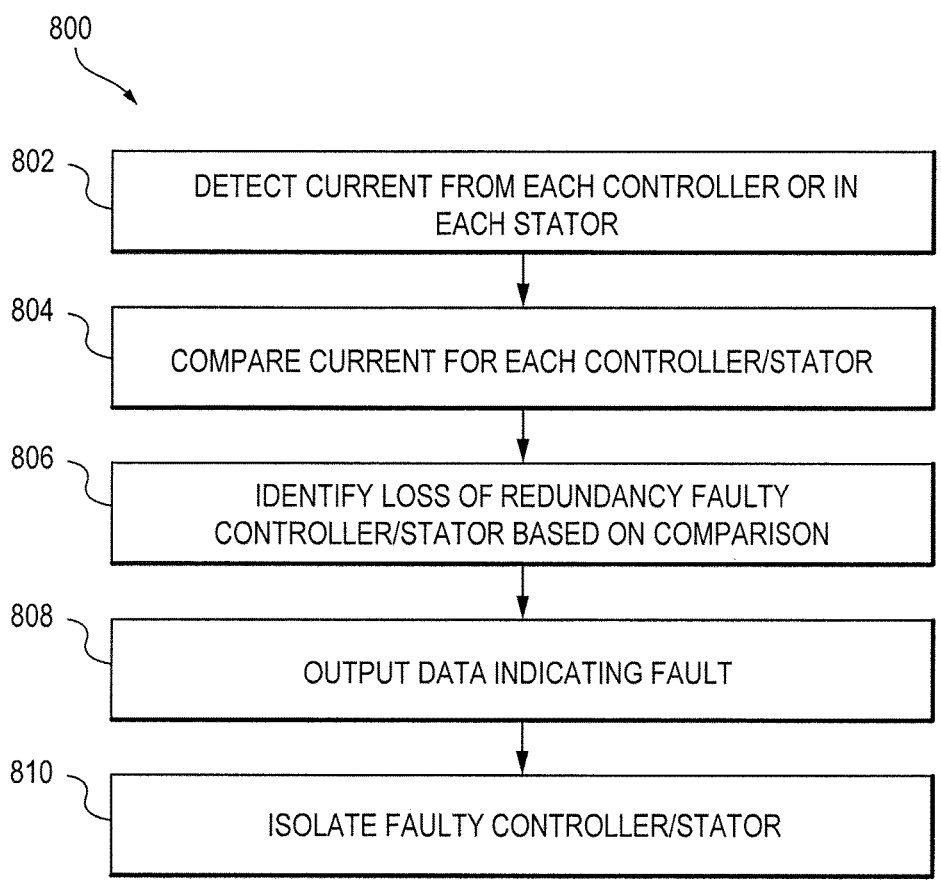
FIG. 8 is a flowchart illustrating a method for monitoring a status of a linear motor actuator by comparing current received by multiple stators, in accordance with various embodiments of the present disclosure.

Turning now to FIG. 8, a method 800 for monitoring a linear motor actuator is shown. In block 802, current may be detected from a current sensor located in each controller or each stator, or located between each pair of controllers and stators. This detected current may be received by a monitor or one of the controllers, such as a master controller.

In block 804, the detected currents may be compared to each other. For example, the monitor may compare the detected currents to determine whether each of the detected currents is within a tolerance current level of each other, or whether one or more of the detected currents is outside of the tolerance current level of another detected current.

In block 806, the monitor may identify a loss of redundancy of the linear motor actuator based on the comparison of block 804. In various embodiments, the monitor may further identify a faulty controller or stator (the monitor may be incapable of identifying whether the controller or stator is faulty) based on the comparison. In various embodiments, the monitor may be capable of identifying whether it is the controller or the stator that is faulty.

In block 808, the monitor may control an output device to output data indicating the loss of redundancy or the fault. In various embodiments, the linear motor actuator may only have two stators. In that regard, the monitor may be incapable of identifying which stator is faulty and may simply output data indicating the loss of redundancy.

In block 810, if the monitor is capable of identifying a faulty controller or stator, then the monitor may isolate the faulty stator. For example, the monitor may prevent the faulty stator from receiving current from the corresponding controller such as by instructing the controller to cease providing the current or by controlling a switch to prevent the faulty stator from receiving the current. If the monitor is capable of identifying whether the controller or stator is faulty, then the monitor may control a switch between a faulty controller and the corresponding stator to prevent current being provided to the stator by the faulty controller.

In various embodiments, the monitor may determine whether to isolate the faulty stator based on logic. For example, the faulty stator may act against the remaining stators (e.g., the faulty stator may push the translator rod while the stators are commanded to pull the translator rod). In this example, the monitor may determine to isolate the faulty stator because it is wasting power and may cause damage.

In various embodiments, the linear motor actuator may only have two stators. In that regard, the monitor may be incapable of identifying which stator is faulty and may simply output data indicating the loss of redundancy.

Although the disclosure has been directed to a linear actuator motor, the systems and methods may similarly apply to a rotary motor. In that regard and with reference to FIG. 3, the translator rod 104 may be replaced with a rotor 104 such that the stators 102 force rotation of the rotor 104 in response to current being applied to the stators 102.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Different cross-hatching is used throughout the figures to denote different parts but not necessarily to denote the same or different materials.

Systems, methods and apparatus are provided herein. In the detailed description herein, references to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f) unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A system for monitoring a motor, comprising:
   a movable component having a plurality of permanent magnets;
   a plurality of stators having phase windings and surrounding the movable component;
   a plurality of current sensors each configured to detect a detected current flowing to a corresponding stator of the plurality of stators;
   a monitor configured to receive the detected current, perform a comparison of the detected current from each of the plurality of stators, and to identify a loss of redundancy of the motor the based on the comparison; and
   a plurality of controllers, including a master controller and at least one slave controller, each configured to control the corresponding stator of the plurality of stators.

2. The system of claim 1, wherein each of the plurality of current sensors is located in a corresponding controller of the plurality of controllers.

3. The system of claim 1, wherein the monitor is included in the master controller.

4. The system of claim 1, wherein the monitor is configured to identify the loss of redundancy in response to at least one stator of the plurality of stators having a different detected current than another stator of the plurality of stators.

5. The system of claim 4, wherein the plurality of stators includes at least three stators, and wherein the monitor is further configured to identify a faulty stator in response to identifying that the detected current of at least two of the plurality of stators are within a tolerance current level of each other, and that the detected current of the faulty stator is outside the tolerance current level.

6. The system of claim 5, wherein the monitor is further configured to cause the faulty stator to cease receiving current.

7. The system of claim 1 further comprising an output device configured to output data and wherein the monitor is further configured to control the output device to output a notification indicating the loss of redundancy of the motor.

8. A system for monitoring a motor, comprising:
   a movable component having a plurality of permanent magnets;
   a plurality of stators having phase windings and surrounding the movable component;
   a plurality of current sensors each configured to detect a detected current flowing to a corresponding stator of the plurality of stators; and
   a plurality of controllers each configured to control the corresponding stator of the plurality of stators and including a master controller configured to receive the detected current, perform a comparison of the detected current from each of the plurality of stators, and identify a loss of redundancy of the motor based on the comparison.

9. The system of claim 8, wherein each of the plurality of current sensors is located in a corresponding controller of the plurality of controllers.

10. The system of claim 8, wherein the master controller is configured to identify the loss of redundancy in response to at least one stator of the plurality of stators having a different detected current than another stator of the plurality of stators.

11. The system of claim 10, wherein the plurality of stators includes at least three stators, and wherein the master controller is further configured to identify a faulty stator in response to identifying that the detected current of at least two of the plurality of stators are within a tolerance current level of each other, and that the detected current of the faulty stator is outside of the tolerance current level.

12. The system of claim 11, wherein the master controller is further configured to cause the faulty stator to cease receiving current.

13. The system of claim 8 further comprising an output device configured to output data including a notification indicating the loss of redundancy of the motor.

14. A method for monitoring a motor, comprising:
   receiving, by a monitor, a detected current corresponding to each of a plurality of stators;
   performing a comparison, by the monitor, of the detected current from each of the plurality of stators;
   identifying, by the monitor, a loss of redundancy of the motor based on the comparison; and
   outputting, by an output device, output data including a notification indicating the loss of redundancy of the motor.

15. The method of claim 14, wherein identifying the loss of redundancy of the motor includes identifying the loss of redundancy in response to at least one stator of the plurality of stators having a different detected current than another stator of the plurality of stators.

17. The method of claim 16, further comprising identifying, by the monitor, a faulty stator in response to identifying that the detected current of at least two of the plurality of stators are within a tolerance current level of each other, and that the detected current of the faulty stator is outside of the tolerance current level.

17. The method of claim 16, further comprising preventing, by the monitor, the faulty stator from receiving current.

\* \* \* \* \*